United States Patent
Kuroda

(10) Patent No.: US 7,888,978 B2
(45) Date of Patent: Feb. 15, 2011

(54) FREQUENCY SYNTHESIZER

(75) Inventor: Hidehiko Kuroda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 45 days.

(21) Appl. No.: 12/320,326

(22) Filed: Jan. 23, 2009

(65) Prior Publication Data

US 2009/0189700 A1 Jul. 30, 2009

(30) Foreign Application Priority Data

Jan. 30, 2008 (JP) .............................. 2008-019485

(51) Int. Cl.
*H03B 19/00* (2006.01)
(52) U.S. Cl. .................. 327/117; 327/107; 327/113; 327/114; 327/115; 327/116; 327/118; 327/119; 327/156; 327/161
(58) Field of Classification Search ............... 327/107, 327/117, 156, 161
See application file for complete search history.

(56) References Cited

U.S. PATENT DOCUMENTS

| 6,441,690 B1 * | 8/2002 | Savelli et al. ............... 331/1 A |
| 6,828,863 B2 | 12/2004 | Itkin et al. |
| 2003/0155949 A1 | 8/2003 | Itkin et al. |
| 2010/0097106 A1 * | 4/2010 | Kravitz ...................... 327/117 |

FOREIGN PATENT DOCUMENTS

JP 2003-198366 7/2003

* cited by examiner

*Primary Examiner*—Lincoln Donovan
*Assistant Examiner*—John W Poos
(74) *Attorney, Agent, or Firm*—McGinn Intellectual Property Law Group, PLLC

(57) ABSTRACT

A frequency synthesizer includes first and second frequency dividers for receiving and frequency-dividing a signal generated by a voltage-controlled oscillator, a frequency mixer for mixing output signals of the first and second frequency dividers, and a third frequency divider for receiving and frequency-dividing a signal having one frequency of two frequencies that are output by the frequency mixer. The first, second third and frequency dividers and the frequency mixer are provided in a feedback loop within a PLL circuit between the voltage-controlled oscillator and the phase comparator. The phase comparator has a first input terminal to which a signal to which a signal that is output by the third frequency divider is input and a second input terminal to which a reference clock signal that is output by a reference signal generator is input. A loop filter supplies the voltage-controlled oscillator with a voltage that is based upon result of the phase comparison by a phase comparator. The voltage-controlled oscillator supplies the first and second frequency dividers with a signal that oscillates at a frequency corresponding to the voltage input to the oscillator.

20 Claims, 7 Drawing Sheets

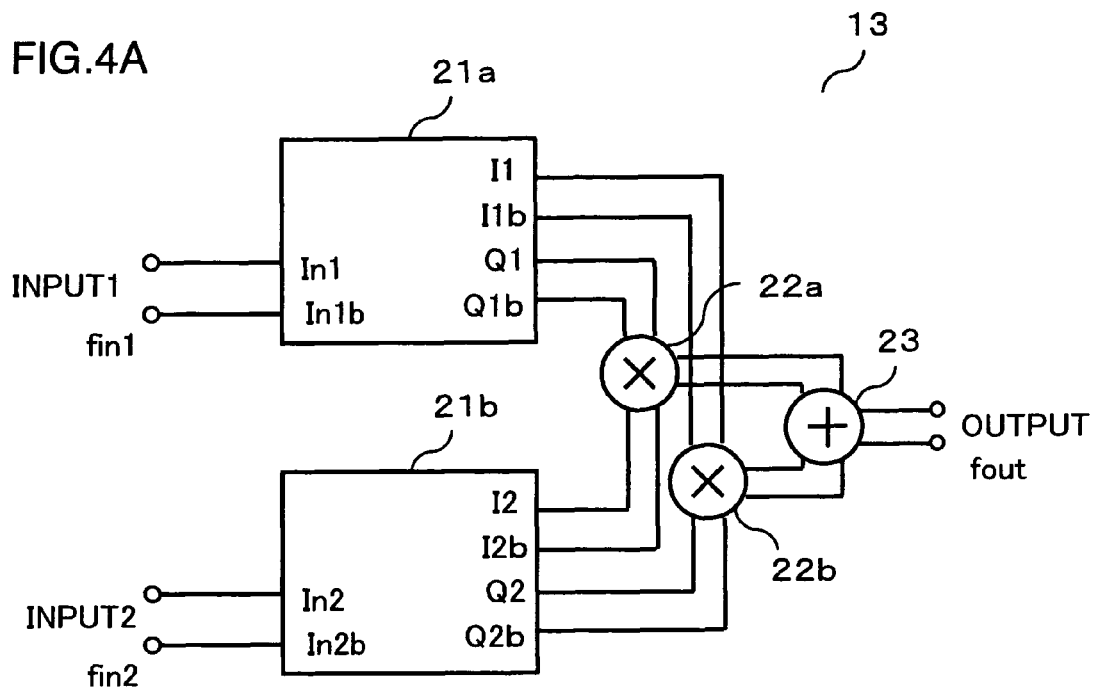
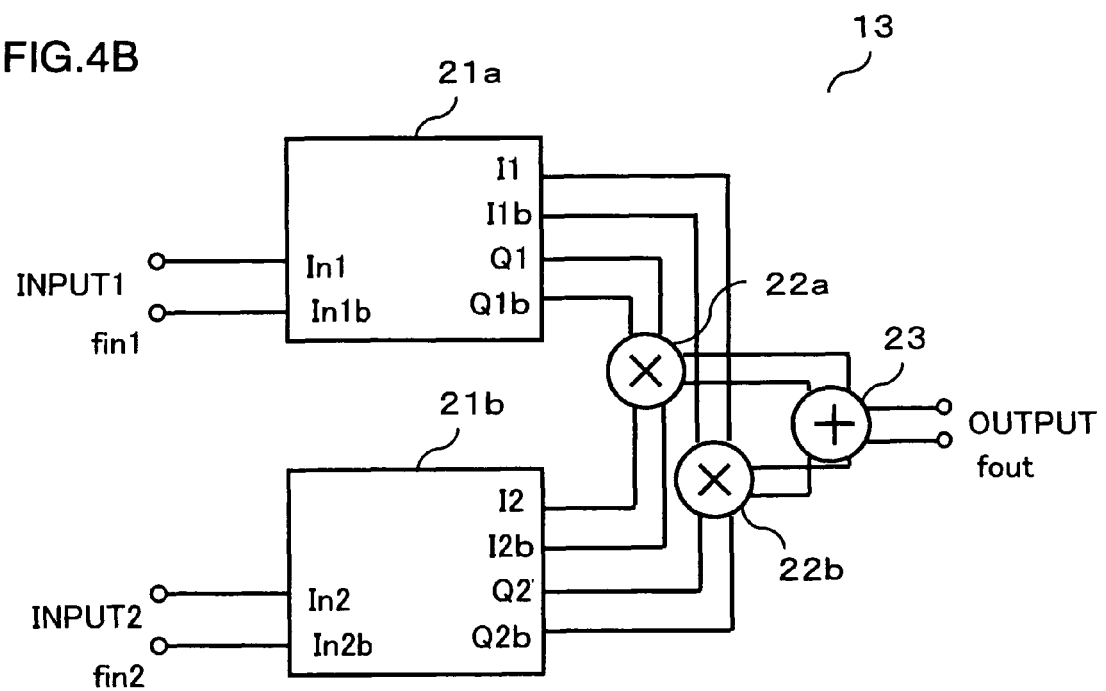

FREQUENCY SYNTHESIZER

REFERENCE TO RELATED APPLICATION

This application is based upon and claims the benefit of the priority of Japanese patent application No. 2008-019485, filed on Jan. 30, 2008, the disclosure of which is incorporated herein in its entirety by reference thereto.

TECHNICAL FIELD

This invention relates to a frequency synthesizer and, more specifically, to a frequency synthesizer capable of outputting a plurality of fractional frequency-divided outputs or a plurality of integral outputs from a single input.

BACKGROUND

Mobile telephones equipped with a GPS receiver have become widespread globally in recent years. There is a need to reduce the number of component parts and lower the cost of such mobile telephones. From the standpoint of system configuration, the GPS signal frequency and the frequency of the mobile telephone have different reference frequencies and the conventional practice is to equip a single mobile telephone with two reference signal oscillators (such as a TCXO). Generally, a reference signal oscillator is high in cost and hence there is strong demand for a system that operates with a single reference oscillator.

Patent Document 1 discloses a frequency synthesizer for dealing with this demand. The frequency synthesizer described in Patent Document 1 comprises a first frequency synthesizer subunit for converting a reference frequency signal to a signal of a frequency band of a first type; a second frequency synthesizer subunit for converting the reference frequency signal to a signal of a frequency band of a second type and an intermediate frequency signal; and a third frequency synthesizer subunit for converting the reference frequency signal to an auxiliary signal of a fixed frequency, wherein the auxiliary signal is used together with the intermediate frequency signal in generating signals of frequency bands of third and fourth types. Further, the first to third frequency synthesizer subunits each have a phase-locked loop frequency synthesizer for generating an integrally multiplied signal by integrally multiplying a frequency-divided signal.

[Patent Document 1]
Japanese Patent Kokai Publication No. JP2003-198366A

SUMMARY

The analysis set forth below is given in the present invention.

The above Patent Document 1 is incorporated herein by reference thereto in its entirety.

The frequency synthesizer described in Patent Document 1 has three frequency synthesizer units and each frequency synthesizer unit has a phase-locked loop frequency synthesizer. As a consequence, the frequency synthesizer has circuitry of large scale and a complicated circuit arrangement, counted as a drawback.

According to a first aspect of the present invention there is provided a frequency synthesizer which comprises: first and second frequency dividers for receiving and frequency-dividing a clock signal that enters from a common input; and a frequency mixer for mixing output signals of the first and second frequency dividers.

According to a second aspect of the present invention there is provided a frequency synthesizer which comprises: first and second frequency dividers for receiving and frequency-dividing a clock signal that enters from a common input; and a frequency mixer for mixing output signals of the first and second frequency dividers; the first and second frequency dividers and the frequency mixer being provided in a feedback loop within a PLL circuit between a voltage-controlled oscillator and a phase comparator. The phase comparator has a first input terminal to which a signal having one frequency of two frequencies that are output by the frequency mixer is input, and a second input terminal to which a reference clock signal is input.

The meritorious effects of the present invention are summarized as follows.

In accordance with the present invention, the scale of the circuitry can be reduced and the circuit arrangement simplified.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 4A and 4B are block diagrams illustrating frequency mixers each constituted by a single side-band mixer;

PREFERRED MODES OF THE INVENTION

Figure 1:
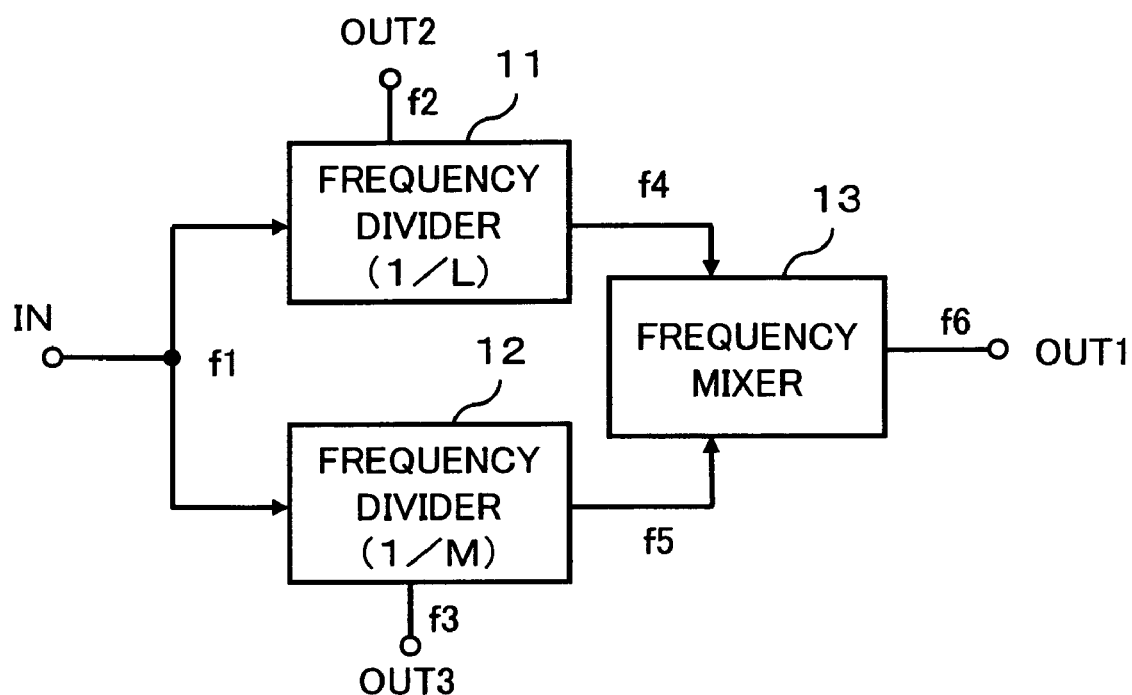
FIG. 1 is a block diagram illustrating the configuration of a frequency synthesizer according to a first exemplary embodiment of the present invention.

A frequency synthesizer according to a first mode of the present invention may comprise first and second frequency dividers 11, 12 (FIG. 1) for receiving and frequency-dividing a clock signal that enters from a common input; and a frequency mixer 13 (FIG. 1) for mixing output signals of the first and second frequency dividers.

The frequency synthesizer of the present invention may further comprise a third frequency divider 14 (FIG. 6) for receiving and frequency-dividing a signal having one frequency of two frequencies that are output by the frequency mixer.

Further, a frequency synthesizer according to another mode of the present invention may comprise first and second frequency dividers 11, 12 (FIG. 7) for receiving and frequency-dividing a clock signal that enters from a common input; and a frequency mixer 13 (FIG. 7) for mixing output signals of the first and second frequency dividers; the first and second frequency dividers and the frequency mixer being provided in a feedback loop within a PLL circuit between a voltage-controlled oscillator 19 (FIG. 19) and a phase comparator 17 (FIG. 7); wherein the phase comparator may have a first input terminal to which a signal having one frequency of two frequencies that are output by the frequency mixer is input, and a second input terminal to which a reference clock signal is input.

The frequency synthesizer according to a further mode of the present invention may further comprise a third frequency divider 14 (FIG. 6) for receiving and frequency-dividing a signal having one frequency of two frequencies that are output by the frequency mixer; the third frequency divider being provided between the frequency mixer and the phase comparator; wherein an output of the third frequency divider is input to the first input terminal of the phase comparator.

The frequency synthesizer according to a still further mode of the present invention may further have an output terminal for outputting a frequency-divided signal from at least one of the first and second frequency dividers.

The frequency synthesizer according to a still further mode of the present invention may further have an output terminal for outputting a frequency-divided signal from at least one among the first, second and third frequency dividers.

The frequency synthesizer according to a still further mode of the present invention may further comprise a fourth frequency divider 15 (FIG. 7) for frequency-dividing and outputting to another output terminal any one of the frequency-divided signals.

In accordance with the frequency synthesizer(s) set forth above, integral frequency dividers and a frequency mixer are combined and used as the method of frequency division, whereby a plurality of fractional frequency-divided output signals and a plurality of integral frequency-divided output signals are obtained. As a result, fractional frequency-divided output signals and integral frequency-divided output signals are obtained simultaneously, the circuit arrangement is simple and the scale of the circuitry can be reduced.

Exemplary Embodiments of the present invention will now be described in detail with reference to the drawings.

First Exemplary Embodiment

FIG. 1 is a block diagram illustrating the configuration of a frequency synthesizer according to a first exemplary embodiment of the present invention. As shown in FIG. 1, the frequency synthesizer includes frequency dividers 11, 12 for receiving a clock signal that enters from a common input IN and frequency-dividing the clock signal, and a frequency mixer 13 for mixing the output signals from the frequency dividers 11, 12.

Letting f1, L (where L is an integer equal to or greater than 1), M (where M is an integer equal to or greater than 1) and f4 and f5 represent the frequency of the clock signal at input IN, the frequency dividing ratio of the frequency divider 11, the frequency dividing ratio of the frequency divider 12, the frequency of the output signal of frequency divider 11 and the frequency of the output signal of frequency divider 12, respectively, we have the following:

$$f4=f1/L, f5=f1/M$$

Further, since the frequency mixer 13 mixes and outputs the output signals of the frequency dividers 11, 12, the frequency of the signal at the output OUT1 of the frequency mixer 13 will be as follows:

$$f6=|f4\pm f5|$$

where f6 represents the frequency.

Accordingly, we have the following:

$$f6=|f1/L\pm f1/M|=|L\pm M|/(LM))\cdot f1$$

This means that the signal at the output OUT1 is the result of fractional frequency division of the signal at the input IN.

Furthermore, by using a single sideband (SSB) mixer or a mixer having a high-pass filter or low-pass filter at the output thereof as the frequency mixer 13, only one frequency of the two frequencies represented by $f6=|f4\pm f5|$ can be extracted and the frequency at the output OUT1 can be controlled. Specifically, if only one frequency signal is selected by the frequency mixer 13, either of the following signals of frequency f6 that is the result of frequency division can be obtained:

$$f6=(L+M)/(LM)\cdot f1 \text{ or } |L-M|/(LM)\cdot f1$$

The details of the frequency dividers 11, 12 will be described next. The frequency dividers 11, 12 have outputs OUT2, OUT3, respectively, from which it is possible to output signals that are the results of an intermediary of frequency division or final outputs of the frequency dividers. For example, when L=4 holds, two stages of divide-by-two frequency dividers are serially connected and divide-by-four frequency division is obtained. In this case a signal of frequency f2=f1/2 can be obtained at the output OUT2 of the first stage. This output is the result of integral frequency division. Further, by setting frequency division in the frequency divider 12 in similar fashion, a signal of frequency f3 at the output OUT3 of a separate integral frequency division can be obtained.

Figure 2:
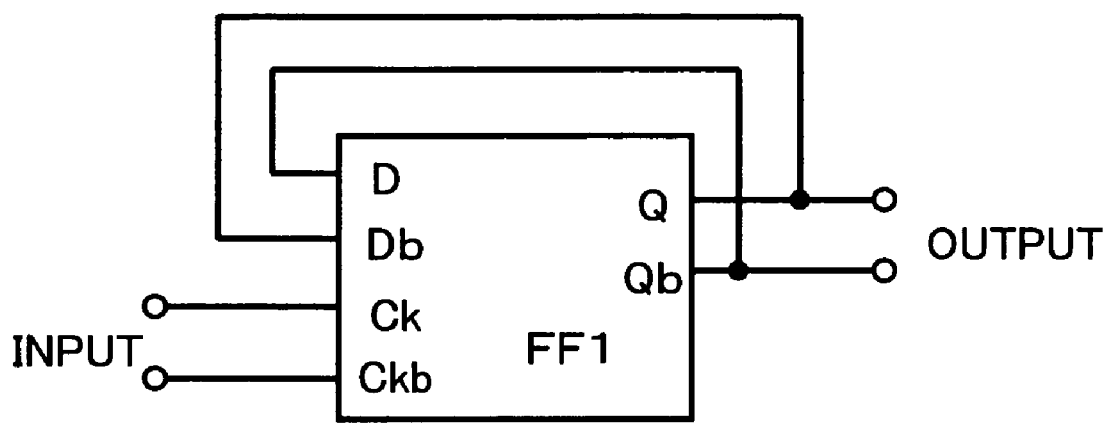
FIG. 2 is a circuit diagram illustrating an example of the configuration of a divide-by-two frequency divider.

FIG. 2 is a circuit diagram illustrating an example of the configuration of a divide-by-two frequency divider. A flip-flop FF1 comprises a D-type flip-flop. This is arranged as a T-flip-flop in which differential signals are input (Ck, Ckb) and frequency-divided and outputs are fed back to D inputs (D, Db) so as to obtain the outputs (Q, Qb).

Figure 3:
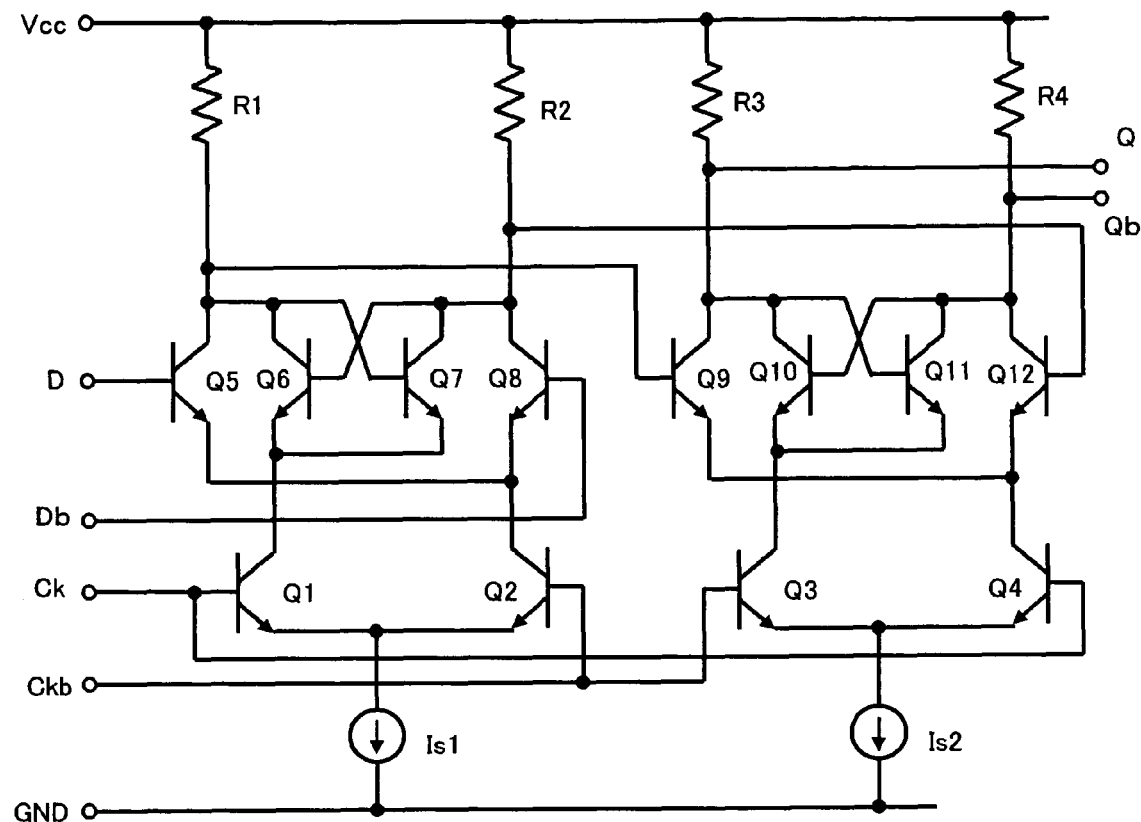
FIG. 3 is a circuit diagram illustrating the details of a D-type flip-flop.

FIG. 3 is a circuit diagram illustrating the details of this D-type flip-flop. The D-type flip-flop has NPN transistors Q1 to Q12, current sources Is1, Is2 and resistance elements R1 to R4. The NPN transistor Q1 has a collector connected to emitters of NPN transistors Q6, Q7, a base to which a clock signal Ck is input and an emitter connected to ground (GND) together with the emitter of an NPN transistor Q2 via a current source Is1. The NPN transistor Q2 has a collector connected to emitters of NPN transistors Q5, Q8 and a base to which a clock signal Ckb, which is opposite in phase with respect to the clock signal Ck, is input. The collectors of the NPN transistors Q5, Q6 and the base of the NPN transistor Q7 are connected in common with power supply Vcc via a resistance element R1. The collectors of the NPN transistors Q7, Q8 and the base of the NPN transistor Q6 are connected in common with power supply Vcc via a resistance element R2. A "D" signal is input to the base of the NPN transistor Q5, and a "Db" signal, which is opposite in phase with respect to the D signal, is input to the base of the NPN transistor Q8.

The NPN transistors Q3, Q4, Q9 to Q12, current source Is2 and resistance elements R3, R4 are connected in a manner similar to that of the above-mentioned NPN transistors Q1, Q2, Q5 to Q8, current source Is1 and resistance elements R1, R2. The clock signals Ckb, Ck are input to the bases of the NPN transistors Q3, Q4, respectively, and the bases of the NPN transistors Q9, Q12 are connected to the collectors of the NPN transistors Q5, Q8, respectively. Further, a Q signal and Qb signal are output from the collectors of the NPN transistors Q9, Q12, respectively.

The D-flop-flop thus constructed is a master/slave-type flip-flop that is operated by differential signals and capable of high-speed toggling.

Further, the frequency divider can be implemented by a bipolar element, a CMOS element or a Bi-CMOS obtained by combining these.

The details of the frequency mixer 13 will be described next. FIGS. 4A, 4B are block diagrams of a frequency mixer constituted by an SSB mixer. The frequency mixer 13 has T-type flip-flops 21a, 21b, mixers 22a, 22b and an adder 23. The T-type flip-flop 21a (21b) frequency-divides by two the differential signals that are input to input terminals INPUT1 (INPUT2) and outputs differential signals that differ in phase by 90° at outputs Q1, Q1b (Q2, Q2b) and differential signals that differ in phase by 90° at outputs I1, I1b (I2, I2b). The mixer 22a (22b) receives as inputs the differential signals at outputs Q1, Q1b (Q2, Q2b) and the differential signals at outputs I2, I2b (I1, I1b), mixes these signals and outputs the resultant signals to the adder 23. The adder 23 adds the differential signals that enter from respective ones of the mixers 22a, 22b and outputs the resultant signals.

FIG. 4B differs from FIG. 4A in that the differential signals that enter from the mixer 22b are reversed in phase.

In the frequency mixers 13 constructed as set forth above, the signal of one sideband in the differential signals that enter from the mixers 22a, 22b is cancelled by the adder 23 and only the signal of the other sideband is output. That is, letting fin1, fin2 represent the frequencies of the two input signals and fout the frequency of the output signal, we have the following:

$$fout = fin1 + fin2 \text{ or } fout = |fin1 - fin2|$$

Figure 5:
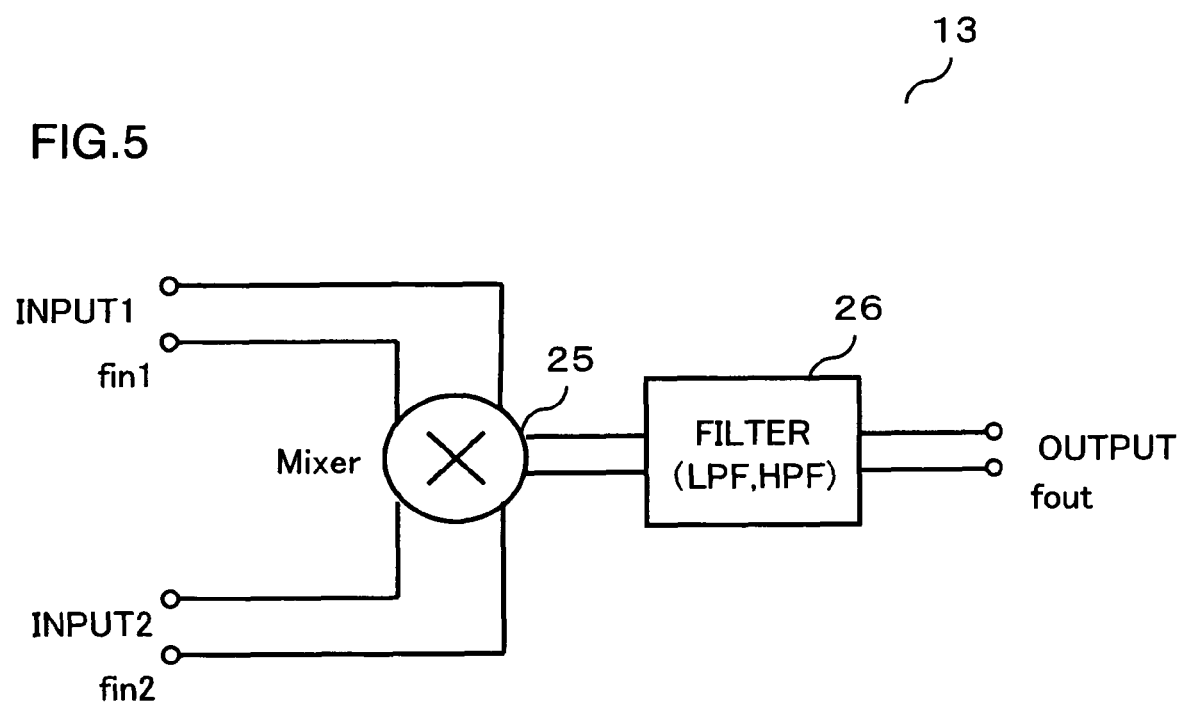
FIG. 5 is a block diagram illustrating a frequency mixer constituted by a mixer having a high-pass filter or a low-pass filter at the output thereof.

FIG. 5 is a block diagram of the frequency mixer 13 constituted by a mixer having a high-pass filter (HPF) or low-pass filter (LPF) at its output. The frequency mixer 13 has a mixer 25 and a filter 26. The mixer 25 receives as inputs the differential signals at input terminals INPUT1 and the differential signals at input terminals INPUT2, mixes these signals and outputs the resultant signals to the filter 26. The filter 26 is a high-pass filter or low-pass filter, passes the upper sideband or lower sideband signal in the differential signals that enter from the mixer 25 and outputs the result to output terminals OUTPUT.

In accordance with the frequency mixer 13 constructed as set forth above, one sideband signal in the differential signals that enter from the mixer 25 is capable of being passed by the filter 26. That is, letting fin1, fin2 represent the frequencies of the two input signals and fout the frequency of the output signal, we have the following:

$$fout = fin1 + fin2 \text{ or } fout = |fin1 - fin2|$$

In accordance with the frequency synthesizer of this exemplary embodiment as described above, the synthesizer is constructed solely by integral dividers and a frequency mixer. One input signal is frequency-divided into frequencies of two types and these signals are mixed in terms of frequency, whereby a signal that is the result of fractional frequency division is obtained. Accordingly, signals of a plurality of output frequencies that are the result of integral frequency division or fractional frequency division can be generated from a single input frequency by a simple arrangement.

Further, since the frequency dividers can all be implemented by integral frequency dividers, circuit configuration and design are facilitated. Furthermore, if the frequency divider portion is formed by fractional frequency dividers, even finer fractional frequency division can be achieved.

Second Exemplary Embodiment

Figure 6:
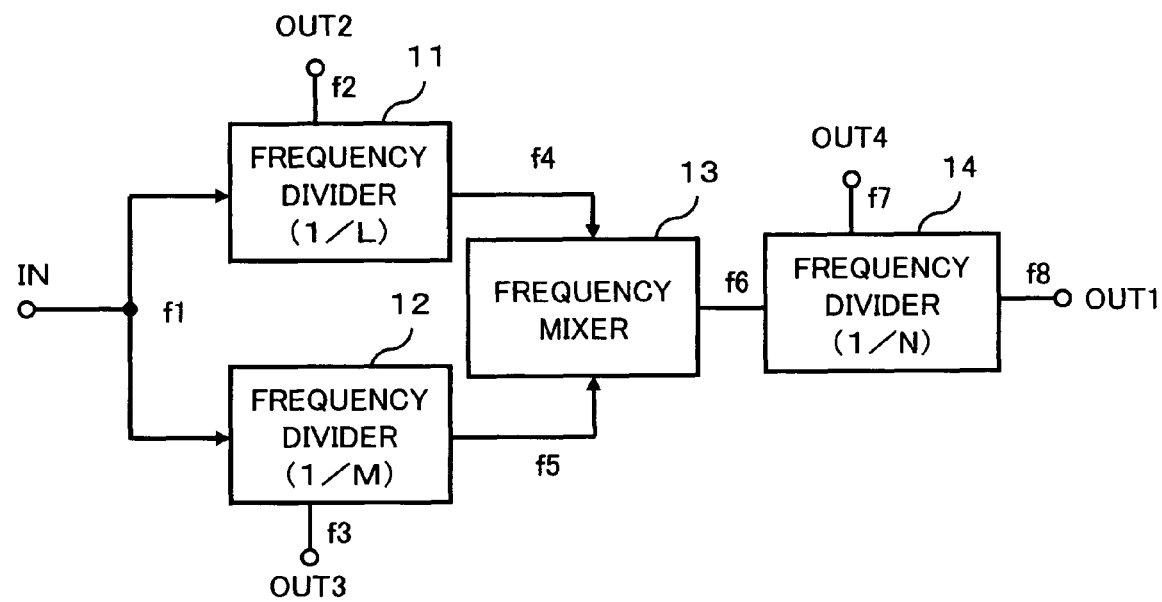
FIG. 6 is a block diagram illustrating the configuration of a frequency synthesizer according to a second exemplary embodiment of the present invention.

FIG. 6 is a block diagram illustrating the configuration of a frequency synthesizer according to a second exemplary embodiment of the present invention. Components in FIG. 6 identical with those shown in FIG. 1 are designated by like reference characters and need not be described again. The frequency synthesizer according to the second exemplary embodiment is constructed by further adding a frequency divider 14, which performs frequency division by N (where N is an integer equal to or greater than 2), to the output side of the frequency mixer 13 in FIG. 1.

In the frequency synthesizer thus constructed, the frequency at an output OUT1 can be expressed as follows:

$$f8 = |f1/L \pm f1/M|/N = |L \pm M|/(LMN) \cdot f1$$

Further, in a case where only one frequency is selected by the frequency mixer 13 as in the first exemplary embodiment, we have $$f8 = (L+M)/(LMN) \cdot f1 \text{ or } |L-M|/(LMN) \cdot f1$$

In the equation cited above, a fractional frequency dividing ratio finer than that of the first exemplary embodiment can be obtained by suitably selecting L, M, N. This means that it is possible to obtain a fractional frequency dividing ratio that cannot be expressed in the first exemplary embodiment.

Third Exemplary Embodiment

Figure 7:
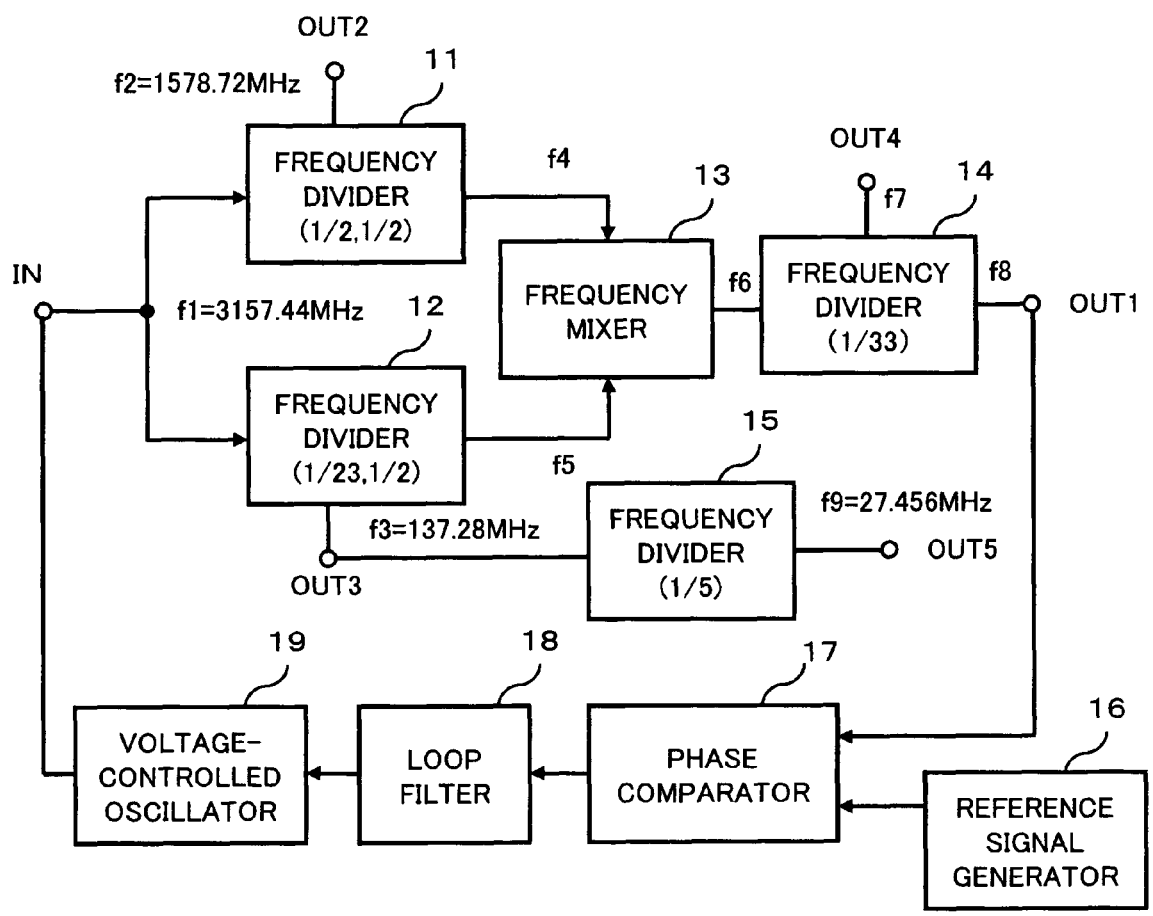
FIG. 7 is a block diagram illustrating the configuration of a frequency synthesizer according to a third exemplary embodiment of the present invention.

FIG. 7 is a block diagram illustrating the configuration of a frequency synthesizer according to a third exemplary embodiment of the present invention. Components in FIG. 7 identical with those shown in FIG. 6 are designated by like reference characters and need not be described again. The frequency synthesizer according to the third exemplary embodiment includes the frequency synthesizer shown in FIG. 6, a reference signal generator 16, a phase comparator 17, a loop filter 18 and a voltage-controlled oscillator 19. Here the frequency synthesizer shown in FIG. 6 is provided in a feedback loop within a PLL circuit between the voltage-controlled oscillator 19 and the phase comparator 17. Further provided is a frequency divider 15 that receives as an input the signal of frequency f3 that is output from the intermediate output OUT3 of the frequency divider 12, frequency-divides this output by five and outputs the result to output OUT5 as a signal of frequency f9.

The phase comparator 17 receives the signal of frequency f8, which is output by the frequency divider, 14, at one input terminal thereof and receives a reference clock signal, which is generated by the reference signal generator 16, at another input terminal thereof. The voltage-controlled oscillator 19 supplies the frequency dividers 11, 12 with a signal that oscillates at a frequency corresponding to a voltage that is input to the oscillator 19.

The frequency synthesizer set forth above constitutes a PLL circuit and operates in such a manner that the frequency f8 that is output by the frequency divider 14 will coincide with the frequency of the reference clock signal generated by the reference signal generator 16.

As a specific example, the frequency synthesizer is used as a PLL frequency synthesizer that is capable of simultaneously operating a GPS receiver and a GSM mobile telephone (for example, 26 MHz), which employ different reference frequencies, using a single reference frequency (26 MHz) for a GSM mobile telephone. Here assume that L=4, M=46, N=33 hold as well as input f1=3157.44 MHz, f2=1578.72 MHz, f3=137.28 MHz (which is further frequency-divided by 5 to obtain 27.456 MHz), f4=789.36 MHz, f5=68.64 MHz, f6=858.0 MHz (the upper-sideband output) and f8=26 MHz. In this case, a signal that is the result of frequency-dividing the input IN by 242.88 (fractional frequency division=6072/25 frequency division) is obtained at output OUT1, and it is possible to simultaneously obtain a signal frequency-divided by 2 at output OUT2, a signal frequency-divided by 23 at output OUT3, and a signal frequency-divided by 5×23 at output OUT5.

With the frequency synthesizer thus constructed, a plurality of reference frequencies applicable to communication systems of two or more types [e.g., a GPS receiving system (RF unit and BB unit) and a mobile telephone system] having different reference frequencies can be generated simultaneously from the single reference signal generator 16 constituted by a TCXO or the like. In this case, this can be realized with the single reference signal generator 16, thereby allowing system cost to be reduced. Furthermore, in comparison with a case where integral frequency division is used, frequencies are averaged and fractional frequency division is obtained. This make it possible to suppress spurious phenomena and contributes to noise suppression in the system.

Further, since the frequency synthesizer generates signals based upon the same reference signal source, synchronization in each system using these signals is facilitated. That is, synchronization using an external clock is unnecessary.

Though the present invention has been described in accordance with the foregoing exemplary embodiments, the invention is not limited to these exemplary embodiments and it goes without saying that the invention covers various modifications and changes that would be obvious to those skilled in the art within the scope of the claims.

What is claimed is:

1. A frequency synthesizer comprising:
   first and second frequency dividers for receiving and frequency-dividing a clock signal that enters from a common input;
   a frequency mixer for mixing output signals of said first and second frequency dividers; and
   a first output terminal and a second output terminal outputting output signals to outside of the frequency synthesizer from among at least two of the first frequency divider, the second frequency divider and the frequency mixer.

2. A frequency synthesizer comprising:
   first and second frequency dividers for receiving and frequency-dividing a clock signal that enters from a common input;
   a frequency mixer for mixing output signals of said first and second frequency dividers; and
   a third frequency divider for receiving and frequency-dividing a signal having one frequency of two frequencies that are output by said frequency mixer.

3. A frequency synthesizer comprising:
   first and second frequency dividers for receiving and frequency-dividing a clock signal that enters from a common input; and
   a frequency mixer for mixing output signals of said first and second frequency dividers,
   wherein said first and second frequency dividers and said frequency mixer are provided in a feedback loop within a PLL (phase-locked loop) circuit between a voltage-controlled oscillator and a phase comparator, and
   wherein said phase comparator has a first input terminal to which a signal having one frequency of two frequencies that are output by said frequency mixer is input, and a second input terminal to which a reference clock signal is input.

4. The synthesizer according to claim 3, further comprising a third frequency divider for receiving and frequency-dividing a signal having one frequency of two frequencies that are output by said frequency mixer,
   wherein said third frequency divider is provided between said frequency mixer and said phase comparator, and
   wherein an output of said third frequency divider is input to a first input terminal of said phase comparator.

5. The synthesizer according to claim 3, further comprising an output terminal for outputting a frequency-divided signal from at least one of said first and second frequency dividers.

6. The synthesizer according to claim 4, further comprising an output terminal for outputting a frequency-divided signal from at least one among said first, second and third frequency dividers.

7. The synthesizer according to claim 5, further comprising a fourth frequency divider for frequency-dividing and outputting to another output terminal outputting any one of the frequency-divided signals.

8. The synthesizer according to claim 6, further comprising a fourth frequency divider for frequency-dividing and outputting to another output terminal outputting any one of the frequency-divided signals.

9. The synthesizer according to claim 1, wherein fractional frequency-divided output signals from at least one of the first and second frequency dividers and an integral frequency divided output signal from the frequency mixer are obtained simultaneously outside of the synthesizer through the first and second output terminals.

10. The synthesizer according to claim 1, wherein the first and second output terminals output signals of different frequencies.

11. The synthesizer according to claim 1, wherein the plurality of output terminals includes the first output terminal, the second output terminal, and a third output terminal outputting output signals to outside of the frequency synthesizer from the first frequency divider, the second frequency divider and the frequency mixer, respectively.

12. The synthesizer according to claim 11, wherein the first, second, and third output terminals output signals of frequencies different from each other.

13. The synthesizer according to claim 1, wherein the first and second frequency dividers and the frequency mixer is provided in a feedback loop within a PLL (phase-locked loop) circuit.

14. The synthesizer of claim 1, further comprising a phase comparator comparing signals from the frequency mixer and a reference signal generator,
   wherein the first and second frequency dividers and the frequency mixer is provided in a feedback loop within a PLL circuit between a voltage-controlled oscillator and the phase comparator.

15. The synthesizer according to claim 1, wherein the first and second frequency dividers and the frequency mixer is provided in a feedback loop within a single PLL circuit.

16. The synthesizer according to claim 3, further comprising a first output terminal for outputting a frequency-divided signal from the first frequency divider and a second output terminal for outputting a frequency-divided signal from the second frequency divider.

17. The synthesizer according to claim 16, wherein outputs of the first and second output terminals are provided outside a circuit of the synthesizer.

18. The synthesizer according to claim 16, further comprising a third output terminal for outputting a mixed output signals of the first and second frequency dividers from the frequency mixer to outside of the synthesizer.

19. The synthesizer according to claim 3, wherein the first and second frequency dividers and the frequency mixer being provided in a feedback loop within a single PLL circuit between a voltage-controlled oscillator and the phase comparator.

20. The synthesizer according to claim 3, wherein fractional frequency-divided output signals from the first and second frequency dividers and an integral frequency divided output signal from the frequency mixer are obtained simultaneously outside of the synthesizer.

* * * * *